(12) United States Patent
Lee et al.

(10) Patent No.: US 11,387,535 B2
(45) Date of Patent: Jul. 12, 2022

(54) THREE-DIMENSIONAL STACKED PARALLEL-PARALLEL POWER COMBINER AND THREE-DIMENSIONAL STACKED PARALLEL POWER COMBINER WITH FULLY SYMMETRICAL STRUCTURE, AND COMMUNICATION SYSTEM INCLUDING THE SAME

(71) Applicant: SAMSUNG ELECTRONICS CO., LTD., Suwon-si (KR)

(72) Inventors: Ockgoo Lee, Busan (KR); Hyunjin Ahn, Busan (KR); Sanghoon Sim, Seoul (KR)

(73) Assignees: SAMSUNG ELECTRONICS CO., LTD., Suwon-si (KR); PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 0 days.

(21) Appl. No.: 17/190,003

(22) Filed: Mar. 2, 2021

(65) Prior Publication Data

US 2021/0376440 A1    Dec. 2, 2021

(30) Foreign Application Priority Data

May 26, 2020    (KR) .................... 10-2020-0062783

(51) Int. Cl.
*H04M 1/00*    (2006.01)
*H01P 5/12*    (2006.01)
(Continued)

(52) U.S. Cl.
CPC ............... *H01P 5/12* (2013.01); *H01F 27/28* (2013.01); *H03F 3/21* (2013.01); *H04M 1/026* (2013.01); *H03F 2200/451* (2013.01)

(58) Field of Classification Search
CPC combination set(s) only.
See application file for complete search history.

(56) References Cited

U.S. PATENT DOCUMENTS 6,816,012 B2    11/2004  Aoki et al.
7,940,152 B1*    5/2011  Kim ...................... H01F 19/04
                                                         336/182

(Continued)

FOREIGN PATENT DOCUMENTS

KR    10-2017-0022670 A    3/2017

*Primary Examiner* — Nhan T Le
(74) *Attorney, Agent, or Firm* — Sughrue Mion, PLLC

(57) ABSTRACT

A 3D stacked parallel-parallel power combiner includes first and second parallel power combining transformers and a first parallel power combiner. The first parallel power combining transformer includes first and second primary windings receiving first and second input signals, and a first secondary winding coupled to the first and second primary windings and providing a first output signal based on the first and second input signals. The second parallel power combining transformer includes third and fourth primary windings receiving third and fourth input signals, and a second secondary winding coupled to the third and fourth primary windings and providing a second output signal based on the third and fourth input signals. The first parallel power combiner is connected to output terminals of the first and second parallel power combining transformers and provides a third output signal by combining the first and second output signals.

20 Claims, 13 Drawing Sheets

(51) Int. Cl.
*H01F 27/28* (2006.01)
*H04M 1/02* (2006.01)
*H03F 3/21* (2006.01)

(56) References Cited

U.S. PATENT DOCUMENTS

| | | | |
|---|---|---|---|
| 7,952,433 | B2 | 5/2011 | An et al. |
| 8,797,135 | B2 | 8/2014 | Lai |
| 8,912,865 | B2 * | 12/2014 | Kim .................. H03H 7/48 |
| | | | 333/131 |
| 9,130,537 | B2 * | 9/2015 | Tsai .................. H01F 19/04 |
| 9,319,007 | B2 | 4/2016 | Yeh et al. |
| 9,431,473 | B2 | 8/2016 | Lo et al. |
| 9,722,571 | B2 * | 8/2017 | Tsai .................. H03H 7/48 |
| 10,388,449 | B2 | 8/2019 | Park et al. |
| 10,581,388 | B2 | 3/2020 | Jin et al. |
| 2017/0352470 | A1 | 12/2017 | Yamagami et al. |

\* cited by examiner

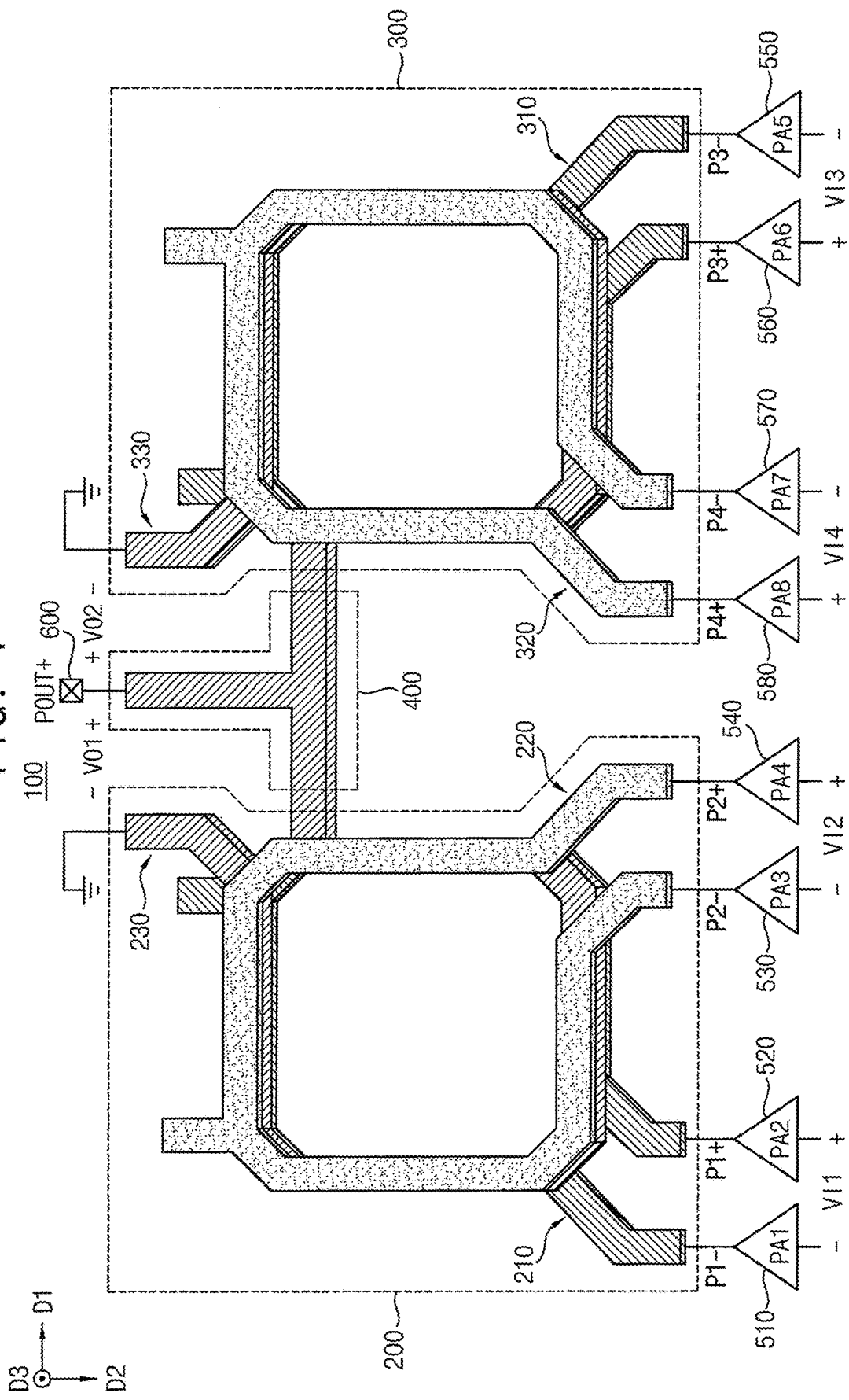

FIG. 2C
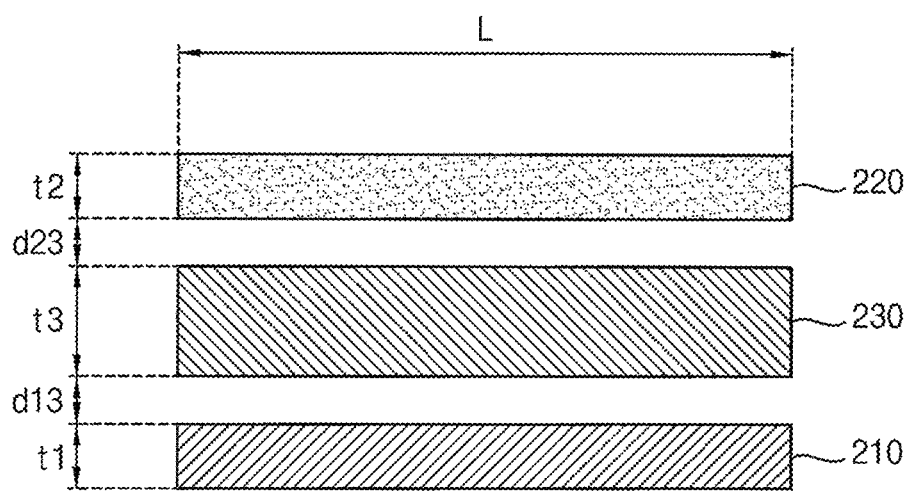
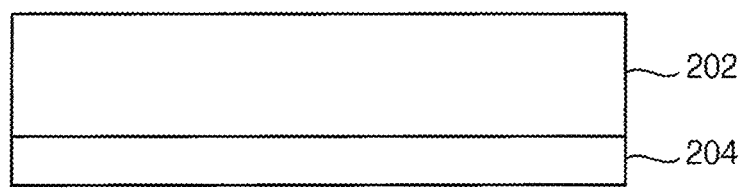
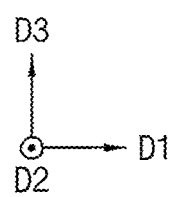

THREE-DIMENSIONAL STACKED PARALLEL-PARALLEL POWER COMBINER AND THREE-DIMENSIONAL STACKED PARALLEL POWER COMBINER WITH FULLY SYMMETRICAL STRUCTURE, AND COMMUNICATION SYSTEM INCLUDING THE SAME

CROSS-REFERENCE TO THE RELATED APPLICATION

This application claims priority from Korean Patent Application No. 10-2020-0062783, filed on May 26, 2020 in the Korean Intellectual Property Office, the contents of which are incorporated herein by reference in their entirety.

BACKGROUND

Field

Apparatuses and methods consistent with example embodiments relate generally to semiconductor integrated circuits, and more particularly to three-dimensional (3D) stacked parallel-parallel power combiners with fully symmetrical structures, 3D stacked parallel power combiners with fully symmetrical structures, and communication systems including the 3D stacked parallel-parallel power combiners.

Related Art

A fifth generation (5G) mobile communication system, which is currently being studied, requires a network capacity of about several tens to several hundred times greater than a long term evolution (LTE) mobile communication system, which is a fourth generation (4G) mobile communication system. A communication technology based on millimeter wave communication is being studied to ensure wide bandwidth for the 5G mobile communication system. In addition, a transformer-based power combiner is being studied to increase an output power in a millimeter wave band.

In a related power combiner having a series-connected structure, there is a problem that the asymmetrical structure may cause asymmetrical parasitic capacitances. For example, a parasitic capacitance between a primary winding and a secondary winding may not have symmetry, and thus the imbalance in a magnitude and phase of a signal may occur. Accordingly, various power combiner structures have been studied to solve the above-described asymmetry problem.

SUMMARY

At least one example embodiment provides a three-dimensional (3D) stacked parallel-parallel power combiner and a 3D stacked parallel power combiner capable of having relatively simple structure and fully symmetrical structure for efficient power combining.

At least one example embodiment provides a communication system including the 3D stacked parallel-parallel power combiner.

According to example embodiments, a three-dimensional (3D) stacked parallel-parallel power combiner includes a first parallel power combining transformer, a second parallel power combining transformer and a first parallel power combiner. The first parallel power combining transformer includes a first primary winding, a second primary winding and a first secondary winding. The first primary winding receives a first input signal. The second primary winding receives a second input signal. The first secondary winding is coupled to the first and second primary windings, and provides a first output signal based on the first and second input signals. The second parallel power combining transformer includes a third primary winding, a fourth primary winding and a second secondary winding. The third primary winding receives a third input signal. The fourth primary winding receives a fourth input signal. The second secondary winding is coupled to the third and fourth primary windings, and provides a second output signal based on the third and fourth input signals. The first parallel power combiner is connected to an output terminal of the first parallel power combining transformer and an output terminal of the second parallel power combining transformer, and provides a third output signal based on the first and second output signals. The first parallel power combining transformer has a 3D stacked structure in which the first primary winding, the second primary winding and the first secondary winding are stacked in a vertical direction. The second parallel power combining transformer has a 3D stacked structure in which the third primary winding, the fourth primary winding and the second secondary winding are stacked in the vertical direction.

According to example embodiments, a communication system includes a signal processor, a transmission path and an antenna. The signal processor processes data to be transmitted and generates a plurality of input transmission signals based on the processed data. The transmission path provides an output transmission signal based on the plurality of input transmission signals to the antenna, and includes a three-dimensional (3D) stacked parallel-parallel power combiner. The antenna outputs the output transmission signal. The 3D stacked parallel-parallel power combiner includes a first parallel power combining transformer, a second parallel power combining transformer and a first parallel power combiner. The first parallel power combining transformer includes a first primary winding, a second primary winding and a first secondary winding. The first primary winding receives a first input transmission signal. The second primary winding receives a second input transmission signal. The first secondary winding is coupled to the first and second primary windings, and provides a first output signal based on the first and second input transmission signals. The second parallel power combining transformer includes a third primary winding, a fourth primary winding and a second secondary winding. The third primary winding receives a third input transmission signal. The fourth primary winding receives a fourth input transmission signal. The second secondary winding is coupled to the third and fourth primary windings, and provides a second output signal based on the third and fourth input transmission signals. The first parallel power combiner is connected to an output terminal of the first parallel power combining transformer and an output terminal of the second parallel power combining transformer, and provides the output transmission signal based on the first and second output signals. The first parallel power combining transformer has a 3D stacked structure in which the first primary winding, the second primary winding and the first secondary winding are stacked in a vertical direction. The second parallel power combining transformer has a 3D stacked structure in which the third primary winding, the fourth primary winding and the second secondary winding are stacked in the vertical direction.

According to example embodiments, a three-dimensional (3D) stacked parallel power combiner includes a first power amplifier, a second power amplifier, a third power amplifier, a fourth power amplifier, a first primary winding, a second primary winding and a first secondary winding. The first power amplifier receives one of a pair of first differential input signals. The second power amplifier receives the other of the first differential input signals. The third power amplifier receives one of a pair of second differential input signals. The fourth power amplifier receives the other of the second differential input signals. The first primary winding includes a first input terminal connected to an output terminal of the first power amplifier and a second input terminal connected to an output terminal of the second power amplifier, and receives the first differential input signals amplified by the first and second power amplifiers. The second primary winding includes a first input terminal connected to an output terminal of the third power amplifier and a second input terminal connected to an output terminal of the fourth power amplifier, and receives the second differential input signals amplified by the third and fourth power amplifiers. The first secondary winding is shared by the first and second primary windings, and provides a pair of first differential output signals by combining the first differential input signals and the second differential input signals. The first primary winding, the second primary winding and the first secondary winding have a 3D stacked structure in which the first primary winding, the second primary winding and the first secondary winding are stacked in a vertical direction. In a cross-sectional view, the first secondary winding is interposed between the first primary winding and the second primary winding.

The 3D stacked parallel-parallel power combiner according to example embodiments may include two parallel power combining transformers. Each parallel power combining transformer may include two primary windings and one secondary winding that are connected in parallel, and may have the 3D stacked structure in which two primary windings are positioned above and below one secondary winding and two primary windings are magnetically coupled to one secondary winding vertically. An additional manufacturing process may not be required to implement the 3D stacked structure, and the 3D stacked structure may be manufactured using the semiconductor manufacturing process. Also, two parallel power combining transformers may be connected in parallel using the T-type parallel power combiner, without an additional conversion circuit. Further, the parasitic capacitances between the primary and secondary windings may be formed symmetrically, and thus the power may be combined while maintaining symmetry. Accordingly, the power combiner may be efficiently implemented with full symmetry and excellent performance while having a small size with the low cost.

The communication system according to example embodiments may include the 3D stacked parallel-parallel power combiner with full symmetry and excellent performance, and thus may have improved or enhanced performance.

BRIEF DESCRIPTION OF THE DRAWINGS

The above and other objects and features will become more apparent from the following description of example embodiments with reference to the accompanying drawings in which:

FIG. 1 is a diagram illustrating a three-dimensional (3D) stacked parallel-parallel power combiner according to example embodiments.

FIGS. 2A, 2B and 2C are diagrams illustrating a first parallel power combining transformer included in the 3D stacked parallel-parallel power combiner of FIG. 1.

DETAILED DESCRIPTION

Figure 2A:
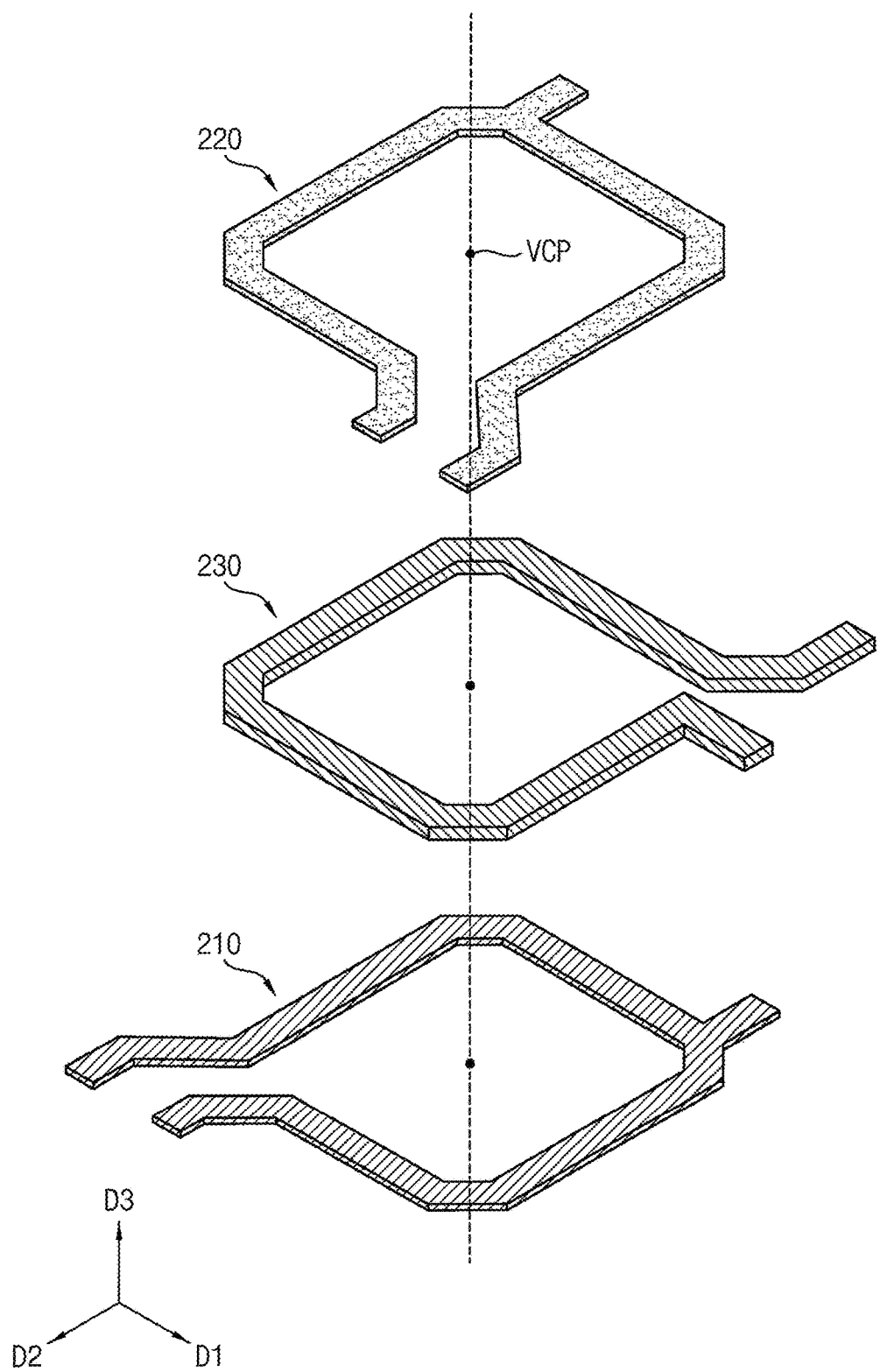

The above and other aspects and features will become more apparent by describing example embodiments in detail with reference to the accompanying drawings. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. The same reference numerals are used to denote the same elements in the drawings, and repeated descriptions thereof will be omitted.

Figure 2B:
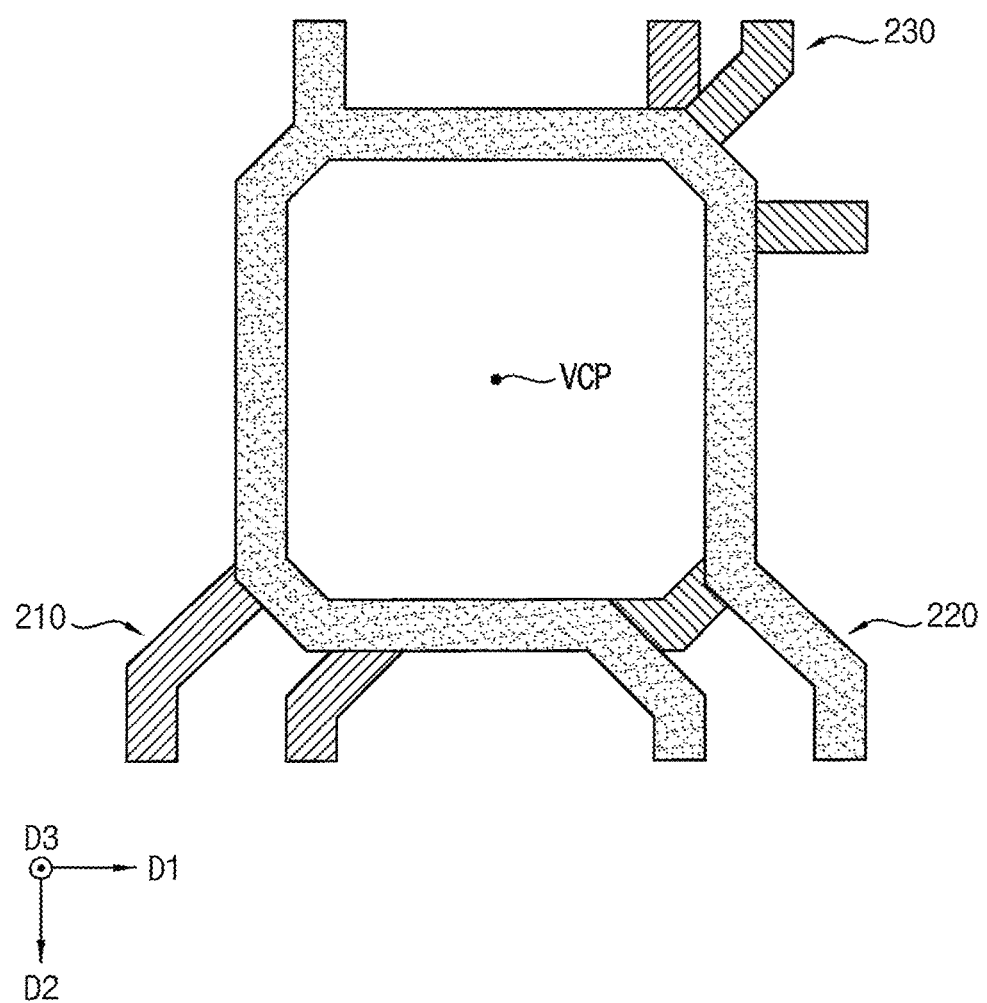

FIG. 1 is a diagram illustrating a three-dimensional (3D) stacked parallel-parallel power combiner according to example embodiments. FIGS. 2A, 2B and 2C are diagrams illustrating a first parallel power combining transformer included in the 3D stacked parallel-parallel power combiner of FIG. 1. FIG. 2A is a perspective view of an arrangement of components or elements included in the first parallel power combining transformer of FIG. 1. FIG. 2B is a plan view of the first parallel power combining transformer of FIG. 2A. FIG. 2C is a cross-sectional view of the first parallel power combining transformer of FIG. 2A.

In FIG. 1, two directions substantially parallel to a first surface (e.g., a top surface) of a substrate (e.g., a semiconductor substrate 202 in FIG. 2C) and crossing each other are referred to as a first direction D1 (e.g., a X-axis direction) and a second direction D2 (e.g., a Y-axis direction). In addition, a direction substantially vertical to the first surface of the substrate is referred to as a third direction D3 (e.g., a Z-axis direction). For example, the first and second directions D1 and D2 may be substantially perpendicular to each other. In addition, the third direction D3 may be substantially perpendicular to both the first and second directions D1 and D2. Further, a direction indicated by an arrow in the figures and a reverse direction thereof are considered as the same direction. The definition of the first, second and third directions D1, D2 and D3 are same in the subsequent figures.

Referring to FIGS. 1, 2A, 2B, 2C and 3, a 3D stacked parallel-parallel power combiner 100 includes a first parallel power combining transformer 200, a second parallel power combining transformer 300 and a first parallel power combiner 400. The 3D stacked parallel-parallel power combiner 100 may further include a plurality of power amplifiers (PA1, PA2, PA3, PA4, PA5, PA6, PA7 and PA8) 510, 520, 530, 540, 550, 560, 570 and 580, and an output terminal 600. Each of the first parallel power combining transformer 200 and the second parallel power combining transformer 300 may be referred to as a parallel power combiner.

The first parallel power combining transformer 200 includes a first primary winding 210, a second primary winding 220 and a first secondary winding 230. The first parallel power combining transformer 200 has a structure in which a combination or coupling of two primary windings 210 and 220 and one secondary winding 230 is formed or connected in parallel.

The first primary winding 210 receives a first input signal VI1. As illustrated in FIG. 1, the first input signal VI1 may include a pair of first differential input signals, and the first primary winding 210 may include two input terminals that receive the first differential input signals, respectively.

The second primary winding 220 receives a second input signal VI2. As with the first input signal VI1, the second input signal VI2 may include a pair of second differential input signals, and the second primary winding 220 may include two input terminals that receive the second differential input signals, respectively.

The first secondary winding 230 is shared by the first primary winding 210 and the second primary winding 220, and provides a first output signal VO1 by combining the first input signal VI1 with the second input signal VI2. Because each of the first input signal VI1 and the second input signal VI2 includes a pair of differential input signals, the first output signal VO1 may also include a pair of first differential output signals, and the first secondary winding 230 may include two output terminals that output the first differential output signals, respectively. One of the two output terminals of the first secondary winding 230 may be connected to a ground voltage, and the other of the two output terminals of the first secondary winding 230 may be connected to the first parallel power combiner 400.

The first parallel power combining transformer 200 has a 3D stacked structure in which the first primary winding 210, the second primary winding 220 and the first secondary winding 230 are stacked in a vertical direction (e.g., the third direction D3). Thus, the first parallel power combining transformer 200 may be referred to as a 3D stacked parallel power combining transformer or a 3D stacked parallel power combiner.

For example, in a cross-sectional view, the first secondary winding 230 may be disposed, arranged or located between the first primary winding 210 and the second primary winding 220. In other words, two primary windings 210 and 220 may be positioned above and below one secondary winding 230. Accordingly, the first secondary winding 230 may be magnetically coupled (or inductively coupled) to the first primary winding 210 and the second primary winding 220 vertically. Thus, two primary windings 210 and 220 and one secondary winding 230 may have a magnetic coupling (or inductive coupling) structure vertically.

The first parallel power combining transformer 200 may be manufactured using a semiconductor manufacturing process (e.g., a complementary metal-oxide semiconductor (CMOS) process). For example, the first primary winding 210, the first secondary winding 230 and the second primary winding 220 may be sequentially stacked on the semiconductor substrate 202 along the third direction D3. A ground electrode 204 may be formed under the semiconductor substrate 202.

In some example embodiments, although not illustrated in FIG. 2C in detail, at least one interlayer insulating layer may be interposed between the semiconductor substrate 202 and the first primary winding 210, between the first primary winding 210 and the first secondary winding 230, and between the first secondary winding 230 and the second primary winding 220. For example, the interlayer insulating layer may be formed of, for example, silicon oxide (SiOx), silicon oxynitride (SiOxNy), silicon nitride (SiNx), germanium oxynitride (GeOxNy), germanium silicon oxide (GeSixOy), and/or a material having a high dielectric constant (e.g. hafnium oxide (HfOx), zirconium oxide (ZrOx), aluminum oxide (AlOx), tantalum oxide (TaOx), hafnium silicate (HfSix), and/or zirconium silicate (ZrSix)).

In some example embodiments, as the first parallel power combining transformer 200 is manufactured using a semiconductor manufacturing process, the first primary winding 210, the first secondary winding 230 and the second primary winding 220 may be disposed in different metal wiring layers among a plurality of metal wiring layers included in a semiconductor device. For example, in a semiconductor device including three or more stacked metal wiring layers, the first primary winding 210 may be formed in a lower metal wiring layer, the second primary winding 220 may be formed in an upper metal wiring layer, and the first secondary winding 230 may be formed in an intermediate metal wiring layer that is interposed between the lower metal wiring layer and the upper metal wiring layer.

In some example embodiments, the first primary winding 210, the second primary winding 220 and the first secondary winding 230 may include a conductive material. For example, the conductive material may be formed using a metal such as copper, tungsten, titanium, aluminum, or the like, or may be formed using polysilicon, a metal, and/or a metal compound.

In some example embodiments, the first primary winding 210 and the first secondary winding 230 may include the same conductive material, and the first primary winding 210 and the second primary winding 220 may include different conductive materials. However, example embodiments are not limited thereto, and the conductive material included in the first primary winding 210, the second primary winding 220 and the first secondary winding 230 may be changed according to example embodiments.

In some example embodiments, for example as shown in the cross-sectional view illustrated in FIG. 2C, a thickness t3 of the first secondary winding 230 may be greater than a thickness t1 of the first primary winding 210 and a thickness t2 of the second primary winding 220. To form the magnetic coupling vertically between one secondary winding 230 and both of the two primary windings 210 and 220, the first secondary winding 230 may be formed thicker than the first and second primary windings 210 and 220.

In some example embodiments, for example as shown in the cross-sectional view illustrated in FIG. 2C, the thickness t1 of the first primary winding 210 may be substantially equal to the thickness t2 of the second primary winding 220. In addition, a first distance d13 between the first secondary winding 230 and the first primary winding 210 may be substantially equal to a second distance d23 between the first secondary winding 230 and the second primary winding 220. As described above, when the first parallel power combining transformer 200 is formed such that the thickness t1 and the thickness t2 are equal to each other and the first distance d13 and the second distance d23 are equal to each other, the symmetry of the first parallel power combining transformer 200 may be effectively implemented. However, example embodiments are not limited thereto. According to example embodiments, the thickness t1 and the thickness t2 may be different from each other, and/or the first distance d13 and the second distance d23 may be different from each other.

In some example embodiments, for example as shown in the plan view illustrated in FIG. 2B, the first primary winding 210, the second primary winding 220 and the first secondary winding 230 may overlap each other. For example, each of the first primary winding 210, the second primary winding 220 and the first secondary winding 230 may have a shape in which a portion of a closed curve is open. The two input terminals of the first primary winding 210, the two input terminals of the second primary winding 220 or the two output terminals of the first secondary winding 230 may be formed at the portion in which the closed curve is open. Excluding the portions where the two input terminals and the two output terminals are formed, a length, a width and a diameter L of the closed curves forming the first primary winding 210, the second primary winding 220 and the first secondary winding 230 may be substantially the same. In addition, the first primary winding 210, the second primary winding 220 and the first secondary winding 230 may be vertically disposed along the third direction D3 such that virtual center points VCP of the closed curves match or coincide with each other. Thus, in a plan view as illustrated in FIG. 2B, the second primary winding 220 disposed at the top may be observed as a whole, and only a portion of the first primary winding 210 and the first secondary winding 230 may be observed.

In some example embodiments, a first turn ratio of the first primary winding 210 and the first secondary winding 230 may be 1:1, and a second turn ratio of the second primary winding 220 and the first secondary winding 230 may be 1:1. By forming each of the first turn ratio and the second turn ratio to 1:1, a load impedance optimized for the plurality of power amplifiers 510, 520, 530, 540, 550, 560, 570 and 580 may be provided. For example, as illustrated in FIGS. 1 and 2A, the number of turns of the first primary winding 210, the number of turns of the second primary winding 220 and the number of turns of the first secondary winding 230 may each be one.

The second parallel power combining transformer 300 includes a third primary winding 310, a fourth primary winding 320 and a second secondary winding 330. As with the first parallel power combining transformer 200, the second parallel power combining transformer 300 has a structure in which a combination or coupling of two primary windings 310 and 320 and one secondary winding 330 is formed or connected in parallel.

The third primary winding 310 receives a third input signal VI3. As illustrated in FIG. 1, the third input signal VI3 may include a pair of third differential input signals, and the third primary winding 310 may include two input terminals that receive the third differential input signals, respectively.

The fourth primary winding 320 receives a fourth input signal VI4. As with the third input signal VI3, the fourth input signal VI4 may include a pair of fourth differential input signals, and the fourth primary winding 320 may include two input terminals that receive the fourth differential input signals, respectively.

The second secondary winding 330 is shared by the third primary winding 310 and the fourth primary winding 320, and provides a second output signal VO2 by combining the third input signal VI3 with the fourth input signal VI4. Because each of the third input signal VI3 and the fourth input signal VI4 includes a pair of differential input signals, the second output signal VO2 may also include a pair of second differential output signals, and the second secondary winding 330 may include two output terminals that output the second differential output signals, respectively. One of the two output terminals of the second secondary winding 330 may be connected to the ground voltage, and the other of the two output terminals of the second secondary winding 330 may be connected to the first parallel power combiner 400.

The second parallel power combining transformer 300 has a 3D stacked structure in which the third primary winding 310, the fourth primary winding 320 and the second secondary winding 330 are stacked in the vertical direction. The second parallel power combining transformer 300 may have a structure substantially similar to that of the first parallel power combining transformer 200. In other words, the structure of the third primary winding 310, the fourth primary winding 320 and the second secondary winding 330 may be substantially similar to the structure of the first primary winding 210, the second primary winding 220 and the first secondary winding 230 described with reference to FIGS. 2A, 2B and 2C. Thus, the repeated and/or redundant descriptions will be omitted.

The first parallel power combiner 400 is connected to one of the output terminals of the first parallel power combining transformer 200 and one of the output terminals of the second parallel power combining transformer 300, and provides a third output signal POUT+ by combining the first output signal VO1 and the second output signal VO2. The third output signal POUT+ may be output as a final output signal through the output terminal 600. The two 3D stacked parallel power combining transformers 200 and 300 may be connected in parallel by the first parallel power combiner 400, and thus the power combiner according to example embodiments illustrated in FIG. 1 may be referred to as the 3D stacked parallel-parallel power combiner 100.

In some example embodiments, the first parallel power combiner 400 may be a T-type parallel power combiner. For example, the first parallel power combiner 400 may include a first input terminal that is connected to one of the two output terminals of the first parallel power combining transformer 200 and receives the first output signal VO1, a second input terminal that is connected to one of the two output terminals of the second parallel power combining transformer 399 and receives the second output signal VO2, and an output terminal that is connected to the output terminal 600 and provides the third output signal POUT+. By combining currents of the first and second secondary windings 230 and 330 in the first and second parallel power combining transformers 200 and 300 using the T-type parallel power combiner, the third output signal POUT+, which is the final output signal, may be effectively provided to the output terminal 600 without any additional circuit (e.g., a conversion circuit).

In some example embodiments, the T-type parallel power combiner, which is the first parallel power combiner 400, may be disposed or formed in the same layer as the first and second secondary windings 230 and 330. Thus, the first parallel power combiner 400 may include the same conductive material as the first and second secondary windings 230 and 330. The first and second secondary windings 230 and 330 and the first parallel power combiner 400 disposed in the same layer are illustrated with the same hatching.

The plurality of power amplifiers 510, 520, 530, 540, 550, 560, 570 and 580 may be connected to the input terminals of the first through fourth primary windings 210, 220, 310 and 320 in the first and second parallel power combining transformers 200 and 300. As described above, because each of the first through fourth input signals VI1, VI2, VI3 and VI4 includes a pair of differential input signals and each of the first through fourth primary windings 210, 220, 310 and 320 includes two input terminals, one primary winding may be connected to two power amplifiers (e.g., a pair of power amplifiers). For example, a pair of power amplifiers connected to one primary winding may have a pseudo-differential structure, and a total of eight individual power amplifiers may be connected to four primary windings.

For example, the first power amplifier 510 may be connected to the first input terminal of the first primary winding 210 and may receive one of the first differential input signals included in the first input signal VI1. The second power amplifier 520 may be connected to the second input terminal of the first primary winding 210 and may receive the other of the first differential input signals. The first and second power amplifiers 510 and 520 may have a pseudo-differential structure, and outputs P1− and P1+ amplified by the first and second power amplifiers 510 and 520 may be provided to the first primary winding 210 as the first input signal VI1.

Similarly, the third power amplifier 530 may be connected to the first input terminal of the second primary winding 220 and may receive one of the second differential input signals included in the second input signal VI2. The fourth power amplifier 540 may be connected to the second input terminal of the second primary winding 220 and may receive the other of the second differential input signals. The third and fourth power amplifiers 530 and 540 may have a pseudo-differential structure, and outputs P2− and P2+ amplified by the third and fourth power amplifiers 530 and 540 may be provided to the second primary winding 220 as the second input signal VI2.

The fifth power amplifier 550 may be connected to the first input terminal of the third primary winding 310 and may receive one of the third differential input signals included in the third input signal VI3. The sixth power amplifier 560 may be connected to the second input terminal of the third primary winding 310 and may receive the other of the third differential input signals. The fifth and sixth power amplifiers 550 and 560 may have a pseudo-differential structure, and outputs P3− and P3+ amplified by the fifth and sixth power amplifiers 550 and 560 may be provided to the third primary winding 310 as the third input signal VI3.

The seventh power amplifier 570 may be connected to the first input terminal of the fourth primary winding 320 and may receive one of the fourth differential input signals included in the fourth input signal VI4. The eighth power amplifier 580 may be connected to the second input terminal of the fourth primary winding 320 and may receive the other of the fourth differential input signals. The seventh and eighth power amplifiers 570 and 580 may have a pseudo-differential structure, and outputs P4− and P4+ amplified by the seventh and eighth power amplifiers 570 and 580 may be provided to the fourth primary winding 320 as the fourth input signal VI4.

Figure 3:
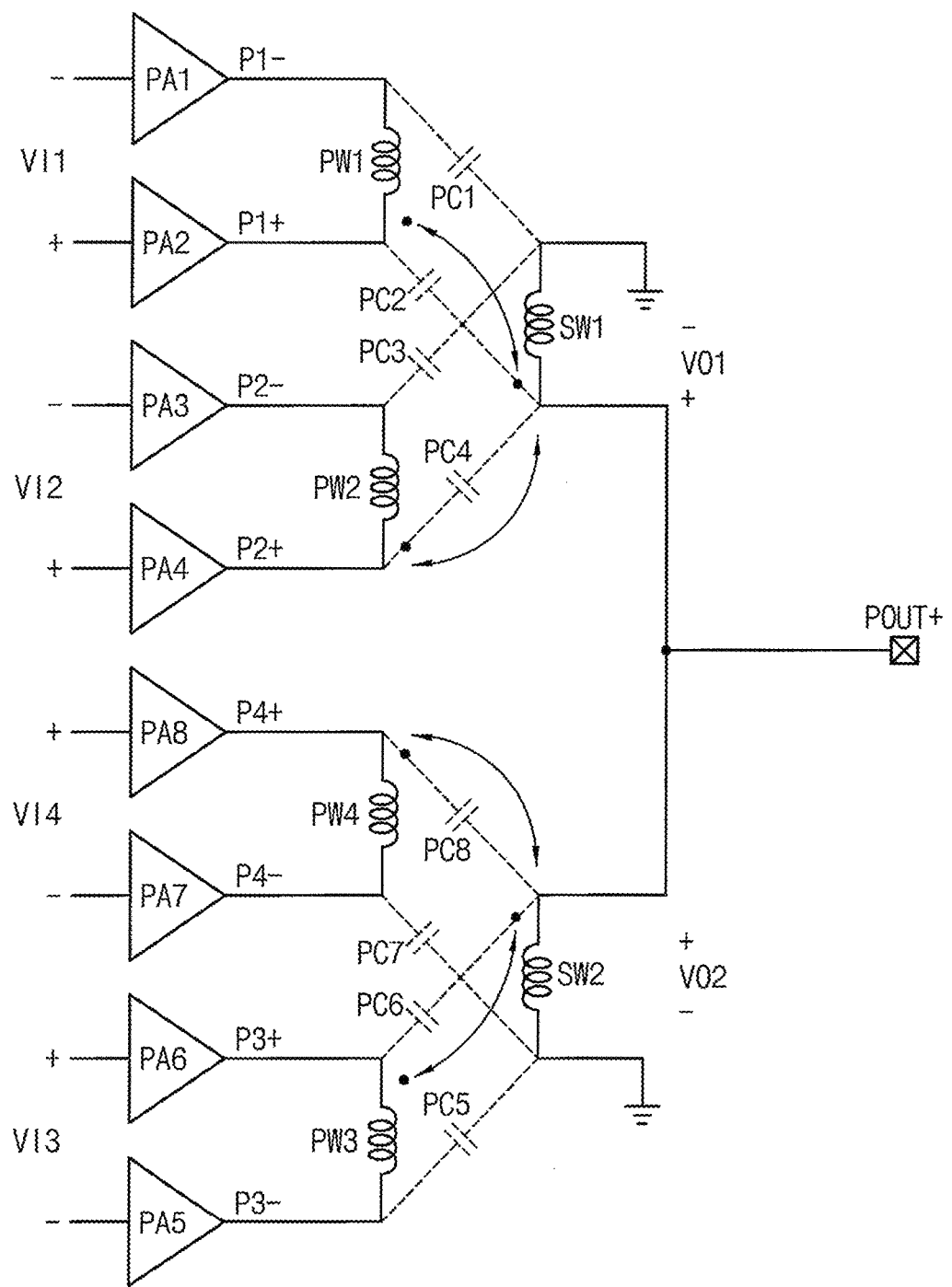
FIG. 3 is a circuit diagram illustrating an equivalent circuit of the 3D stacked parallel-parallel power combiner of FIG. 1.

FIG. 3 is a circuit diagram illustrating an equivalent circuit of the 3D stacked parallel-parallel power combiner of FIG. 1. Power amplifiers PA1, PA2, PA3, PA4, PA5, PA6, PA7 and PA8 may correspond to the power amplifiers 510, 520, 530, 540, 550, 560, 570 and 580 in FIG. 1, respectively, primary windings PW1, PW2, PW3 and PW4 may correspond to the primary windings 210, 220, 310 and 320 in FIG. 1, respectively, and secondary windings SW1 and SW2 may correspond to the secondary windings 230 and 330 in FIG. 1, respectively.

In some example embodiments, parasitic capacitances PC1, PC2, PC3, PC4, PC5, PC6, PC7 and PC8 between the primary windings PW1, PW2, PW3 and PW4 and the secondary windings SW1 and SW2 may be formed symmetrically.

For example, in the first and second input signals VI1 and VI2 of the first and second primary windings PW1 and PW2 and the first output signal VO1 of the first secondary winding SW1, (+) parasitic capacitances may be formed between primary windings having the same polarity and one end of the secondary winding SW1. For example, first and second parasitic capacitances PC1, PC3 are formed between a first end of the secondary winding SW1 and the outputs P1−, P2− which have the same (−) polarity. Similarly, third and fourth parasitic capacitances PC2, PC4 are formed between a second end of the secondary winding SW1 and the outputs P1+, P2+, which have the same (+) polarity. Thus, the parasitic capacitances PC1, PC2, PC3 and PC4 between the first and second primary windings PW1 and PW2 and the first secondary winding SW1 may be formed symmetrically.

Similarly, in the third and fourth input signals VI3 and VI4 of the third and fourth primary windings PW3 and PW4 and the second output signal VO2 of the second secondary winding SW2, (+) parasitic capacitances may be formed between primary windings having the same polarity and one end of the secondary winding SW2. For example, fifth and seventh parasitic capacitances PC5, PC7 are formed between a first end of the secondary winding SW2 and the outputs P3−, P4− which have the same (−) polarity. Similarly, sixth and eighth parasitic capacitances PC6, PC8 are formed between a second end of the secondary winding SW2 and the outputs P3+, P4+, which have the same (+) polarity. Thus, the parasitic capacitances PC5, PC6, PC7 and PC8 between the third and fourth primary windings PW3 and PW4 and the second secondary winding SW2 may be formed symmetrically.

As described above, in the case where the parasitic capacitances PC1, PC2, PC3, PC4, PC5, PC6, PC7 and PC8 between the primary windings PW1, PW2, PW3 and PW4 and the secondary windings SW1 and SW2 are formed symmetrically when viewed from any position, there may be almost no difference in the amplitude and phase of the signal and the amplitude and phase of the signal may have almost fixed values, and thus relatively high efficiency and high linearity characteristics may be implemented without performance degradation.

The 3D stacked parallel-parallel power combiner 100 according to example embodiments may include two parallel power combining transformers. Each parallel power combining transformer may include two primary windings and one secondary winding that are connected in parallel, and may have the 3D stacked structure in which two primary windings are positioned above and below one secondary winding and two primary windings are magnetically coupled to one secondary winding vertically. An additional manufacturing process may not be required to implement the 3D stacked structure, and the 3D stacked structure may be manufactured using the semiconductor manufacturing process. Also, two parallel power combining transformers may be connected in parallel using the T-type parallel power combiner, without an additional conversion circuit. Further, the parasitic capacitances between the primary and secondary windings may be formed symmetrically, and thus the power may be combined while maintaining symmetry. Accordingly, the power combiner may be efficiently implemented with full symmetry and excellent performance while having a small size with the low cost.

FIGS. 4, 5, 6, 7 and 8 are diagrams illustrating the performance of the 3D stacked parallel-parallel power combiner according to example embodiments.

To obtain results of simulation and measurement illustrated in FIGS. 4, 5, 6, 7 and 8, a power amplifier including the 3D stacked parallel-parallel power combiner according to example embodiments was manufactured using a CMOS process.

For example, to form the magnetic coupling vertically between one secondary winding and both of two primary windings, the secondary winding was formed to be between the two primary windings, using M8 metal, which is the thickest metal. One of the two primary windings was formed using M7 metal, which is the second thickest metal, and the other primary winding was formed using an aluminum pad (AP) metal. The 3D stacked parallel-parallel power combiner was implemented by using the features that physical properties of the second thickest metal and the AP metal are almost the same and a distance from the second thickest metal to the thickest metal is almost equal to a distance from the AP metal to the thickest metal, and thus any special and/or additional process was not required. The structure illustrated in FIG. 2C was actually implemented such that the thickness t1 of the M7 metal is about 0.7 um, the thickness t2 of the AP metal is about 1.4 um, the thickness t3 of the M8 metal is about 3.4 um, the distance d13 is about 0.74 um, the distance d23 is about 0.8 um, and the diameter L is about 8 um. In addition, the output of at least one power amplifier was connected to the input of the primary winding, the final output node was connected to the T-type parallel power combiner that combines the currents of the secondary windings of two parallel power combining transformers, and the T-type parallel power combiner was also formed using the thickest metal used in the secondary winding. Further, to provide an optimized load impedance of each power amplifier, the turn ratio of the primary and secondary windings was formed to be 1:1.

Figure 4:
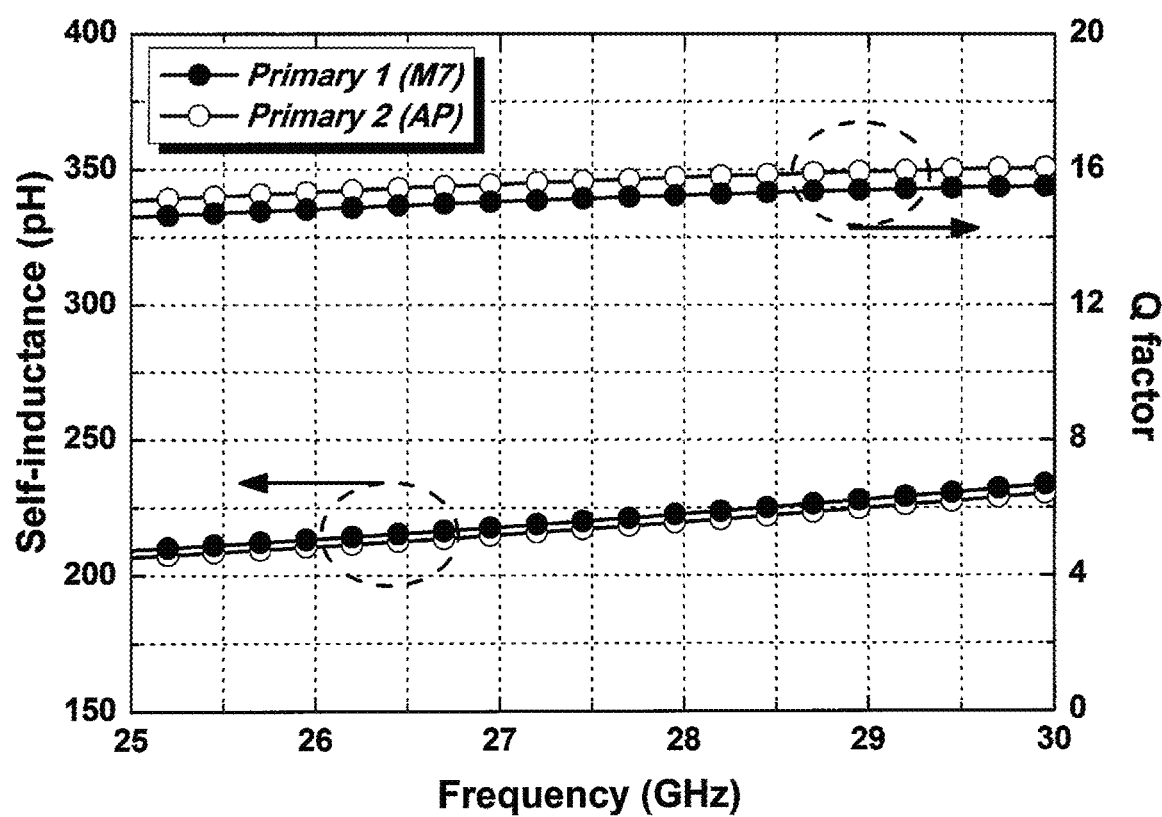
FIGS. 4, 5, 6, 7 and 8 are diagrams illustrating the performance of the 3D stacked parallel-parallel power combiner according to example embodiments.

Referring to FIG. 4, characteristics of a self-inductance and a quality factor (or a Q factor) of the 3D stacked parallel-parallel power combiner according to example embodiments are illustrated. Near a center frequency (e.g., about 28 GHz) of a fifth generation (5G) mobile communication system, the self-inductance and the quality factor of the primary windings formed using the M7 metal and the AP metal are not significantly different from each other and are almost the same.

Figure 5:
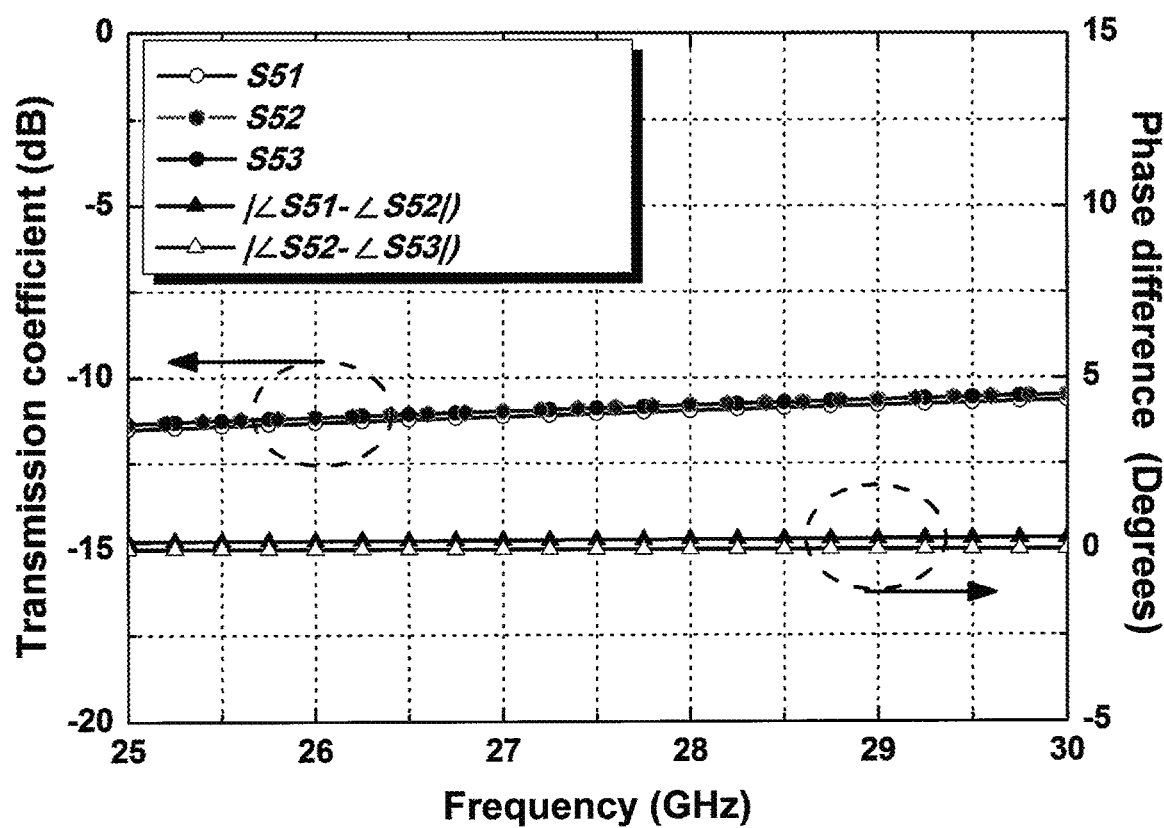

Referring to FIG. 5, characteristics of a magnitude of a transmission coefficient and a phase difference of the 3D stacked parallel-parallel power combiner according to example embodiments are illustrated. Near the center frequency (e.g., about 28 GHz) of the 5G mobile communication system, there are almost no differences in the magnitude of the transmission coefficient and the phase and thus the 3D stacked parallel-parallel power combiner has symmetry.

Figure 6:
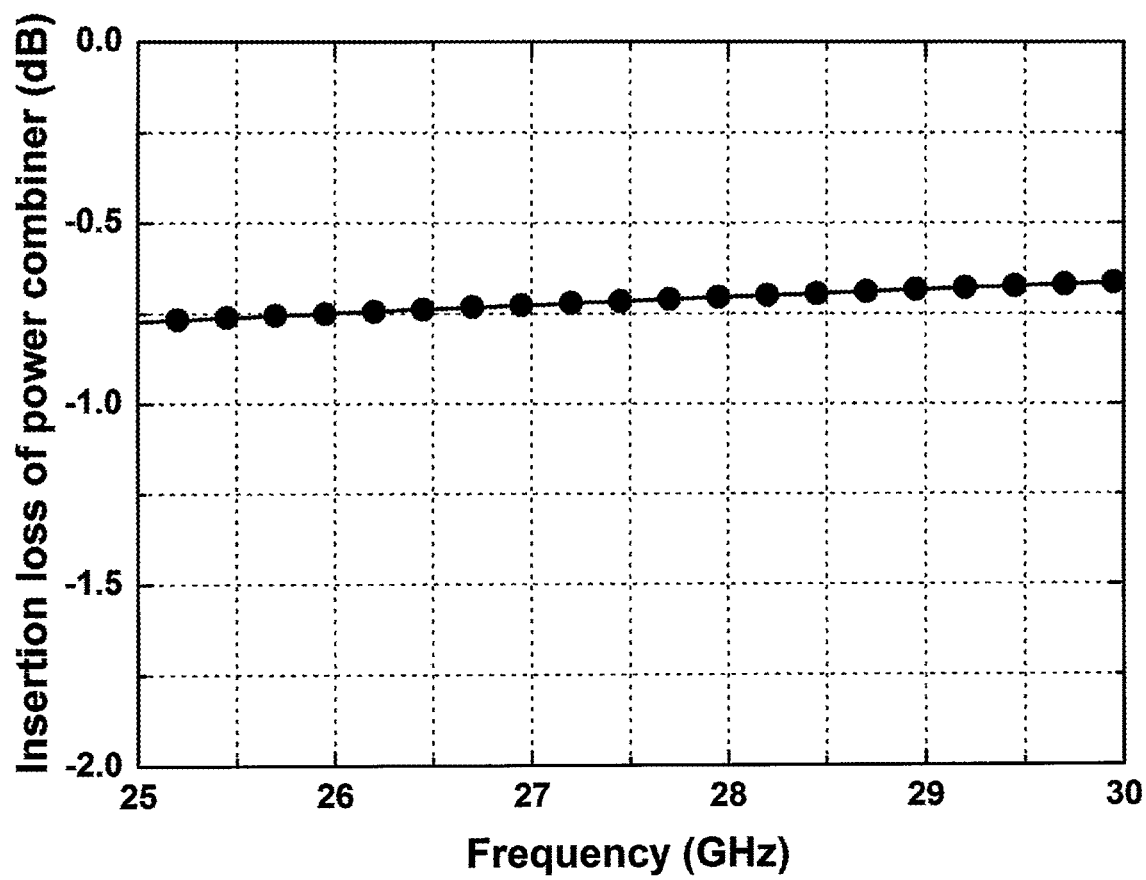

Referring to FIG. 6, a characteristic of loss, e.g., an insertion loss, of the 3D stacked parallel-parallel power combiner according to example embodiments is illustrated. Near the center frequency (e.g., about 28 GHz) of the 5G mobile communication system, the 3D stacked parallel-parallel power combiner has very low insertion loss at about −0.7 dB (92.4%). Thus, performances of high efficiency and high linearity may be obtained when the power amplifier is manufactured using the 3D stacked parallel-parallel power combiner according to example embodiments.

Figure 7:
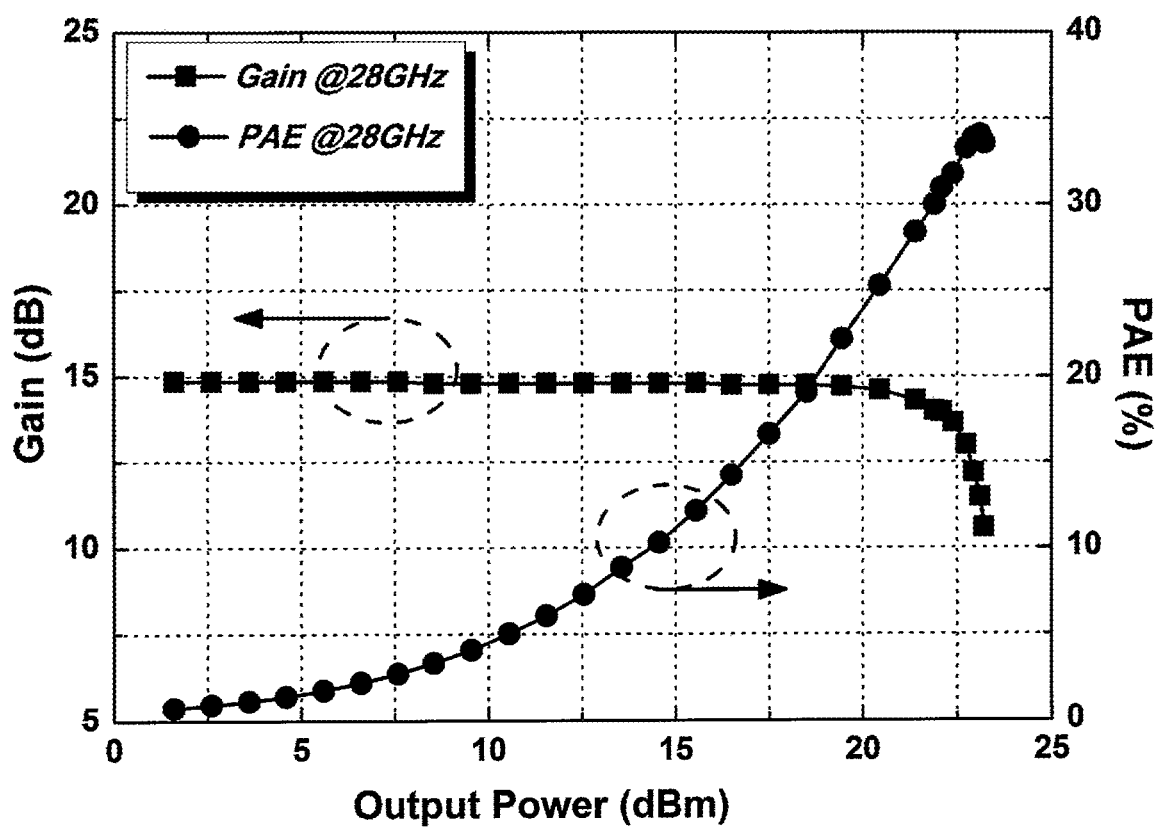
Figure 8:
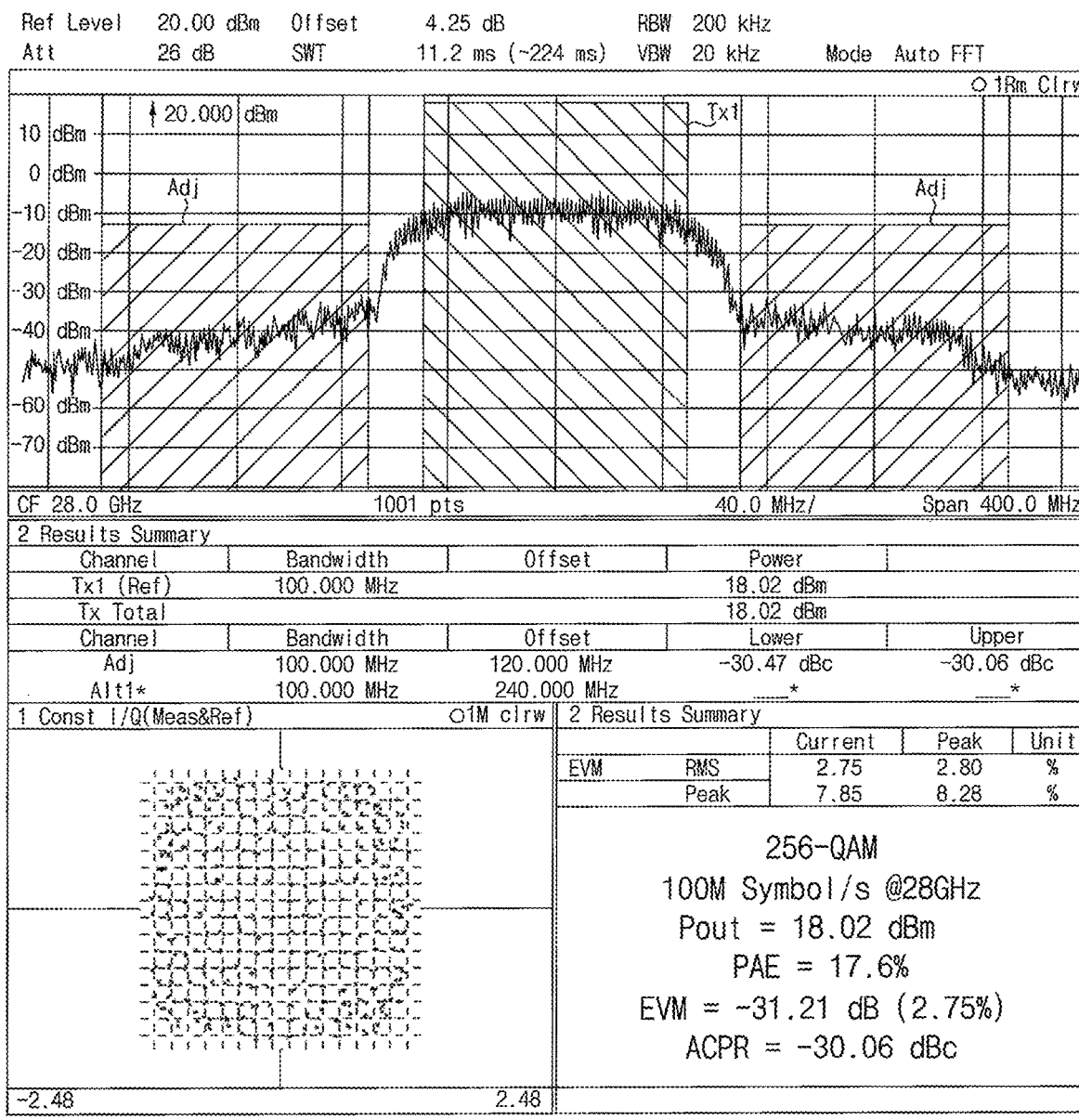

Referring to FIGS. 7 and 8, results of measuring performance of the power amplifier including the 3D stacked parallel-parallel power combiner according to example embodiments manufactured using a CMOS process are illustrated. As illustrated in FIG. 7, when the performance of the power amplifier with a single tone signal was measured at about 28 GHz, which is the center frequency of the 5G mobile communication system, a power gain of about 14.8 dB, a maximum output power of about 23.2 dBm, and a maximum power added efficiency (PAE) of about 33.5% were obtained. In addition, to verify linearity of the power amplifier, the performance of the power amplifier was measured using an orthogonal frequency division multiplexing (OFDM) modulated signal (e.g., 256-QAM (quadrature amplitude modulation) and 100M Sym/s) for the 5G mobile communication system. As illustrated in FIG. 8, when the performance of the power amplifier was measured using the modulated signal, a linear output power (Pout) of about 18.02 dBm, a linear power efficiency of about 17.6%, an error vector magnitude (EVM) of about −31.21 dB, and an adjacent channel power ratio (ACPR) of about −30.06 dBc were obtained, and thus the 3D stacked parallel-parallel power combiner has excellent performance.

As described above, the 3D stacked parallel-parallel power combiner with the fully symmetrical structure according to example embodiments was manufactured using an actual CMOS process. The effectiveness of the structure of the manufactured power amplifier was verified, and it can be seen that the 3D stacked parallel-parallel power combiner has excellent performance based on the results of measuring the performance of the manufactured power amplifier.

Although example embodiments are described based on the case where the 3D stacked parallel-parallel power combiner includes two 3D stacked parallel power combining transformers and one T-type parallel power combiner connecting the two 3D stacked parallel power combining transformers in parallel with each other, example embodiments are not limited thereto. For example, a 3D stacked parallel-parallel power combiner may include three or more 3D stacked parallel power combining transformers and two or more T-type parallel power combiners connecting the three or more 3D stacked parallel power combining transformers in parallel with each other.

Figure 9:
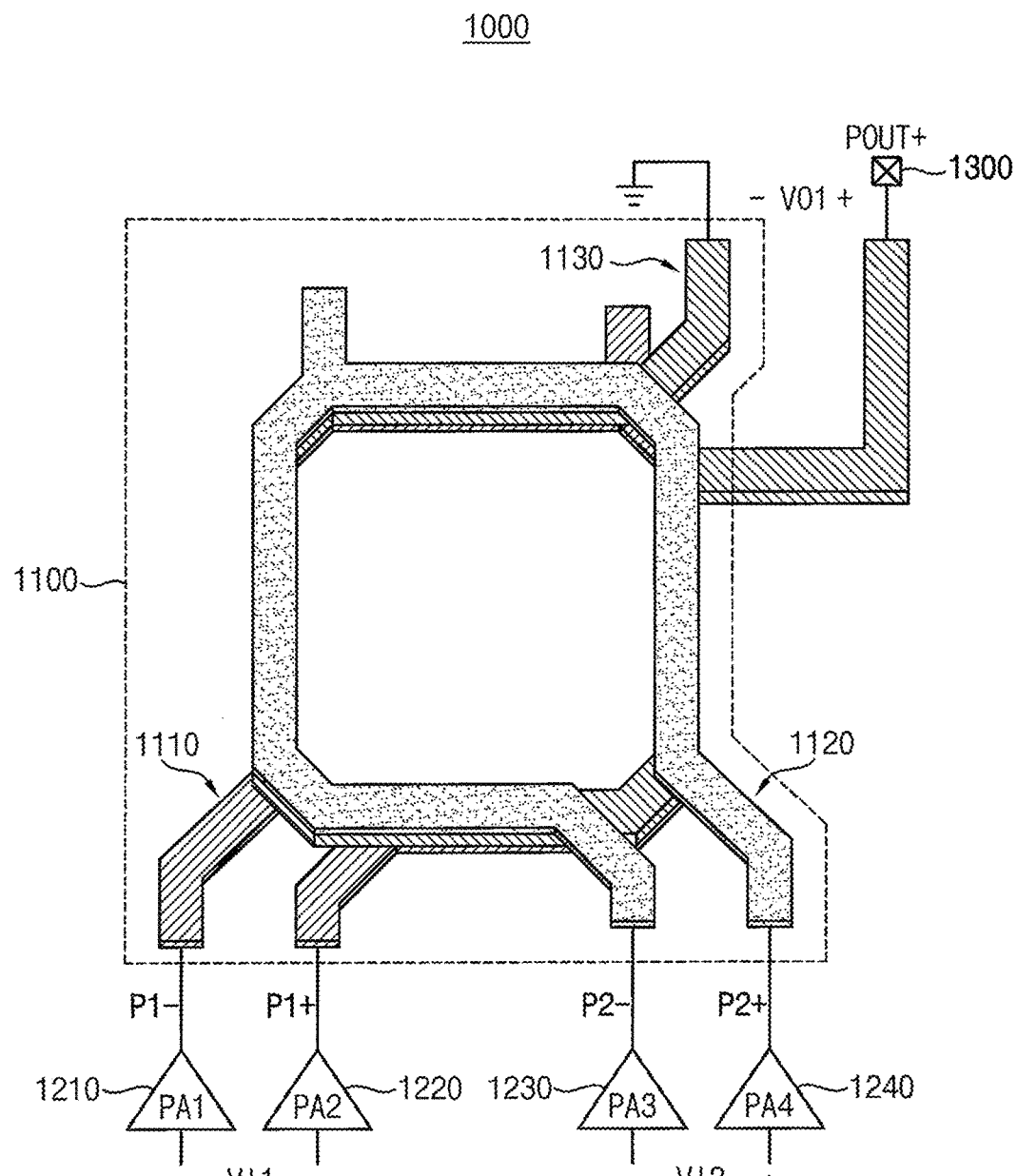
FIG. 9 is a diagram illustrating a 3D stacked parallel power combiner according to example embodiments.
Figure 10:
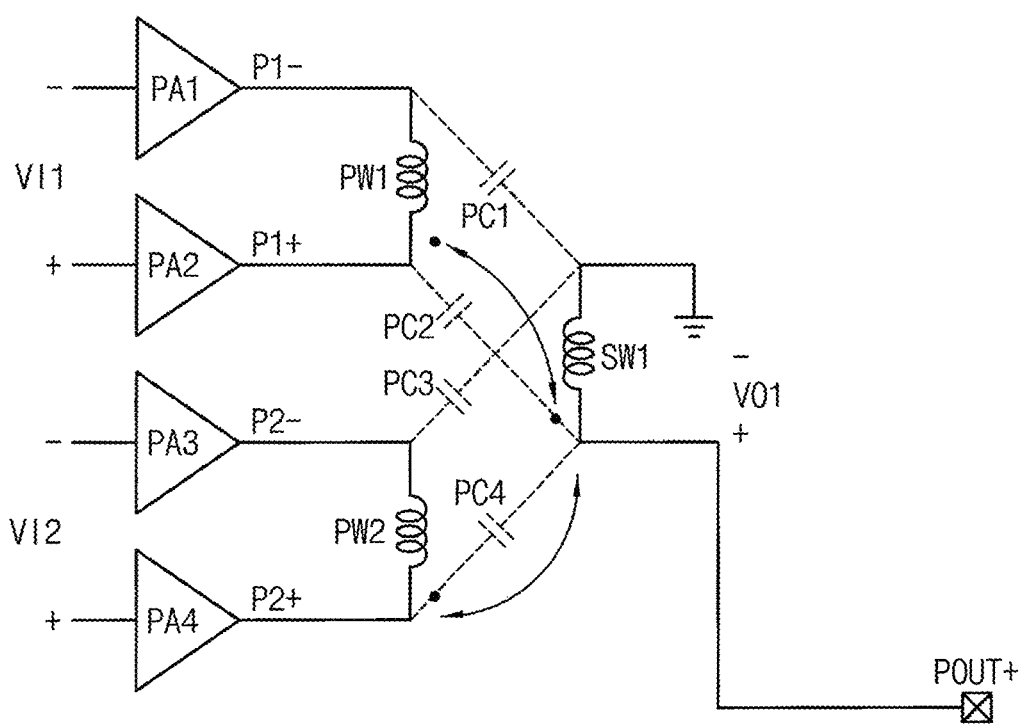
FIG. 10 is a circuit diagram illustrating an equivalent circuit of the 3D stacked parallel power combiner of FIG. 9.

FIG. 9 is a diagram illustrating a 3D stacked parallel power combiner according to example embodiments. FIG. 10 is a circuit diagram illustrating an equivalent circuit of the 3D stacked parallel power combiner of FIG. 9. The descriptions repeated with FIGS. 1, 2A, 2B, 2C and 3 will be omitted.

Referring to FIGS. 9 and 10, a 3D stacked parallel power combiner 1000 includes a first primary winding 1110, a second primary winding 1120 and a first secondary winding 1130. The 3D stacked parallel power combiner 1000 may further include a plurality of power amplifiers (PA1, PA2, PA3 and PA4) 1210, 1220, 1230 and 1240, and an output terminal 1300.

The first primary winding 1110, the second primary winding 1120, the first secondary winding 1130, the plurality of power amplifiers 1210, 1220, 1230 and 1240, and the output terminal 1300 may be substantially similar to the first primary winding 210, the second primary winding 220, the first secondary winding 230, the plurality of power amplifiers 510, 520, 530 and 540, and the output terminal 600 in FIG. 1, respectively.

The plurality of power amplifiers 1210, 1220, 1230 and 1240 may receive a pair of first differential input signals included in a first input signal VI1 and a pair of second differential input signals included in a second input signal VI2, and may be connected to input terminals of the first primary winding 1110 and the second primary winding 1120.

For example, the first power amplifier 1210 may be connected to a first input terminal of the first primary winding 1110 and may receive one of the first differential input signals. The second power amplifier 1220 may be connected to a second input terminal of the first primary winding 1110 and may receive the other of the first differential input signals. The third power amplifier 1230 may be connected to a first input terminal of the second primary winding 1120 and may receive one of the second differential input signals. The fourth power amplifier 1240 may be connected to a second input terminal of the second primary winding 1120 and may receive the other of the second differential input signals.

The first primary winding 1110 includes the first input terminal connected to an output terminal of the first power amplifier 1210 and the second input terminal connected to an output terminal of the second power amplifier 1220, and receives outputs P1− and P1+ of the first and second power amplifiers 1210 and 1220, which are the first differential input signals amplified by the first and second power amplifiers 1210 and 1220.

The second primary winding 1120 includes the first input terminal connected to an output terminal of the third power amplifier 1230 and the second input terminal connected to an output terminal of the fourth power amplifier 1240, and receives outputs P2− and P2+ of the third and fourth power amplifiers 1230 and 1240, which are the second differential input signals amplified by the third and fourth power amplifiers 1230 and 1240.

The first secondary winding 1130 is shared by the first primary winding 1110 and the second primary winding 1120, and provides a first output signal VO1 including a pair of first differential output signals by combining the first differential input signals and the second differential input signals. One of two output terminals of the first secondary winding 1130 may be connected to the ground voltage and the other of the two output terminals may be connected to the output terminal 1300. The first output signal VO1 may be provided as a final output signal POUT+.

The first primary winding 1110, the second primary winding 1120 and the first secondary winding 1130 have a 3D stacked structure 1100 stacked in a vertical direction. In a cross-sectional view, the first secondary winding 1130 is disposed between the first primary winding 1110 and the second primary winding 1120. The arrangement, structure, material and manufacturing process of the 3D stacked structure 1100 including the first primary winding 1110, the second primary winding 1120 and the first secondary winding 1130 may be substantially similar to those described with reference to FIGS. 2A, 2B and 2C.

In an equivalent circuit illustrated in FIG. 10, power amplifiers PA1, PA2, PA3 and PA4 may correspond to the power amplifiers 1210, 1220, 1230 and 1240 in FIG. 9, respectively, primary windings PW1 and PW2 may correspond to the primary windings 1110 and 1120 in FIG. 9, respectively, and a secondary winding SW1 may correspond to the secondary winding 1130 in FIG. 9. The power amplifiers PA1, PA2, PA3 and PA4, the primary windings PW1 and PW2, the secondary winding SW1 and parasitic capacitances PC1, PC2, PC3 and PC4 in FIG. 10 may be substantially similar to the power amplifiers PA1, PA2, PA3 and PA4, the primary windings PW1 and PW2, the secondary winding SW1 and the parasitic capacitances PC1, PC2, PC3 and PC4 in FIG. 3, respectively. The parasitic capacitances PA1, PA2, PA3 and PA4 between the primary windings PW1 and PW2 and the secondary winding SW1 may be formed symmetrically.

The 3D stacked parallel power combiner 1000 according to example embodiments may include two primary windings and one secondary winding that are connected in parallel, and may have the 3D stacked structure in which two primary windings are positioned above and below one secondary winding and two primary windings are magnetically coupled to one secondary winding vertically. An additional manufacturing process may not be required to implement the 3D stacked structure, and the 3D stacked structure may be manufactured using the semiconductor manufacturing process. Further, the parasitic capacitances between the primary and secondary windings may be formed symmetrically, and thus the power may be combined while maintaining symmetry. Accordingly, the power combiner may be efficiently implemented with full symmetry and excellent performance while having a small size with the low cost.

Although example embodiments are described based on the case where the 3D stacked parallel power combiner includes two primary windings and one secondary winding that are connected in parallel and has the 3D stacked structure, example embodiments are not limited thereto. For example, a 3D stacked parallel power combiner may include four or more even numbered primary windings and one secondary winding connected that are in parallel and have the 3D stacked structure, and may be implemented to have a symmetrical structure in which a half of the primary windings are disposed above the secondary winding and the other half of the primary windings are disposed below the secondary winding.

Figure 11:
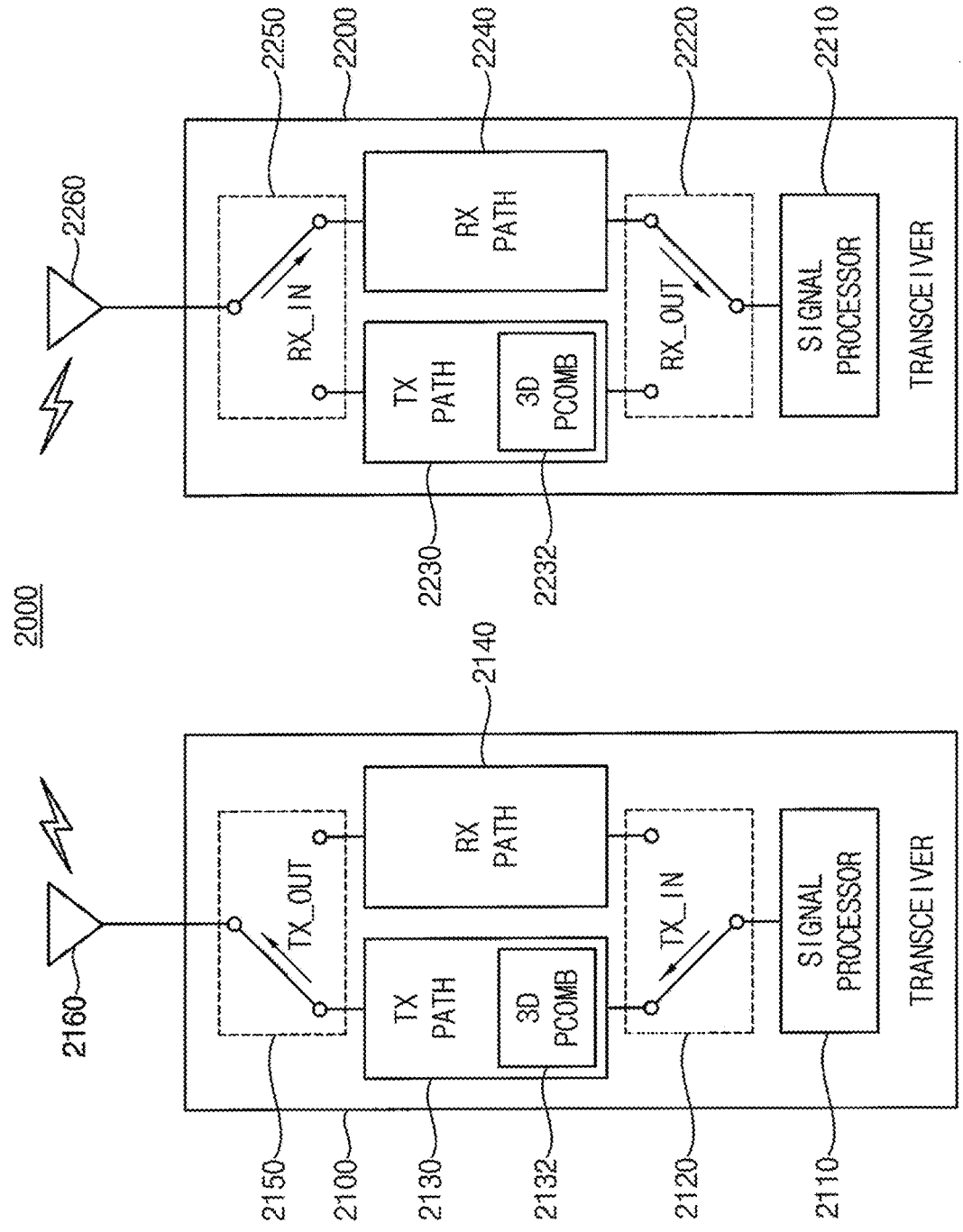
FIG. 11 is a block diagram illustrating a communication system according to example embodiments.

FIG. 11 is a block diagram illustrating a communication system according to example embodiments.

Referring to FIG. 11, a communication system 2000 includes a first transceiver 2100 and a second transceiver 2200.

In some example embodiments, the communication system 2000 may be a 5G mobile communication system having a center frequency of about 28 GHz, and the first transceiver 2100 and the second transceiver 2200 may exchange signals through a wireless channel included in the 5G mobile communication system. For example, each of the first transceiver 2100 and the second transceiver 2200 may be a mobile device such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The first transceiver 2100 may include a first signal processor 2110, a first switch 2120, a first transmission path 2130, a first reception path 2140, a second switch 2150 and a first antenna 2160. In FIG. 11, the first transceiver 2100 is currently operating in a transmission mode.

The first signal processor 2110 may process data to be transmitted and may generate a plurality of input transmission signals TX_IN based on the processed data. For example, the first signal processor 2110 may perform data and/or signal processing such as encoding/decoding, encryption/decryption and/or modulation/demodulation, and may sequentially perform baseband signal processing, intermediate frequency band signal processing and radio frequency (RF) band signal processing in the transmission mode.

The first switch 2120 and the second switch 2150 may connect one of the first transmission path 2130 and the first reception path 2140 with the first signal processor 2110 and the first antenna 2160. When the first transceiver 2100 operates in the transmission mode as illustrated in FIG. 11, the first transmission path 2130 may be connected to the first signal processor 2110 and the first antenna 2160 through the first switch 2120 and the second switch 2150.

The first transmission path 2130 may be enabled or activated in the transmission mode, may provide an output transmission signal TX_OUT based on the plurality of input transmission signals TX_IN, and may include a 3D stacked power combiner 2132 that combines the plurality of input transmission signals TX_IN. The first transmission path 2130 may further include a power amplifier, a phase shifter for phase adjustment, a variable gain amplifier (VGA) or an attenuator for gain adjustment, etc.

The 3D stacked power combiner 2132 may have a structure according to example embodiments. For example, the 3D stacked power combiner 2132 may be implemented in the form of a 3D stacked parallel-parallel power combiner according to example embodiments described with reference to FIGS. 1 through 8, or may be implemented in the form of a 3D stacked parallel power combiner according to example embodiments described with reference to FIGS. 9 and 10. The communication system 2000 may include the 3D stacked power combiner 2132 according to example embodiments that is implemented with full symmetry and excellent performance while having a small size with the low cost, and thus the communication system 2000 may have improved or enhanced performance.

The first reception path 2140 may be disabled or deactivated in the transmission mode. The first antenna 2160 may output the output transmission signal TX_OUT in the transmission mode. For example, the first antenna 2160 may be implemented in the form of an antenna array including a plurality of antennas and may transmit signals based on a beamforming scheme.

The second transceiver 2200 may include a second signal processor 2210, a third switch 2220, a second transmission path 2230, a second reception path 2240, a fourth switch 2250 and a second antenna 2260. In FIG. 11, the second transceiver 2200 is currently operating in a reception mode. A configuration of the second transceiver 2200 may be substantially similar to that of the first transceiver 2100, except that the second transceiver 2200 is illustrated as currently operating in the reception mode.

The second antenna 2260 may receive an input reception signal RX_IN transmitted through the wireless channel. The input reception signal RX_IN may be substantially similar to the output transmission signal TX_OUT.

The third switch 2220 and the fourth switch 2250 may connect one of the second transmission path 2230 and the second reception path 2240 with the second signal processor 2210 and the second antenna 2260. When the second transceiver 2200 operates in the reception mode as illustrated in FIG. 11, the second reception path 2240 may be connected to the second signal processor 2210 and the second antenna 2260 through the third switch 2220 and the fourth switch 2250.

The second reception path 2240 may be enabled in the reception mode, and may provide a plurality of output reception signals RX_OUT based on the input reception signal RX_IN. The second reception path 2240 may further include a low noise amplifier (LNA), a power divider, a phase shifter for phase adjustment, a VGA or an attenuator for gain adjustment, etc. The first reception path 2140 may be substantially similar to the second reception path 2240.

The second transmission path 2230 may be disabled in the reception mode. The second transmission path 2230 may be substantially similar to the first transmission path 2130, and may include a 3D stacked power combiner 2232 having a structure according to example embodiments.

The second signal processor 2210 may process the plurality of output reception signals RX_OUT. For example, the second signal processor 2210 may perform data and/or signal processing such as encoding/decoding, encryption/decryption and/or modulation/demodulation, and may sequentially perform RF band signal processing, intermediate frequency band signal processing and baseband signal processing in the reception mode.

Although FIG. 11 illustrates a case where the first transceiver 2100 operates in the transmission mode and the second transceiver 2200 operates in the reception mode, example embodiments are not limited thereto. For example, the first transceiver 2100 may operate in the reception mode and the second transceiver 2200 may operate in the transmission mode.

In some example embodiments, the first transmission path 2130 and the first reception path 2140 included in the first transceiver 2100 may be implemented to share some components, and/or the second transmission path 2230 and the second reception path 2240 included in the second transceiver 2200 may also be implemented to share some components.

The above-described various example embodiments are implemented by hardware components, software components or combinations of the hardware components and the software components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components.

The foregoing may be applied to various communication devices and systems. For example, example embodiments may be applied to systems such as a personal computer (PC), a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A three-dimensional (3D) stacked parallel-parallel power combiner comprising:
    a first parallel power combining transformer comprising:
        a first primary winding configured to receive a first input signal;
        a second primary winding configured to receive a second input signal; and
        a first secondary winding coupled to the first primary winding and the second primary winding, and configured to provide a first output signal based on the first input signal and the second input signal;
    a second parallel power combining transformer comprising:
        a third primary winding configured to receive a third input signal;
        a fourth primary winding configured to receive a fourth input signal; and
        a second secondary winding coupled to the third primary winding and the fourth primary winding, and configured to provide a second output signal based on the third input signal and the fourth input signal; and
    a first parallel power combiner connected to an output terminal of the first parallel power combining transformer and an output terminal of the second parallel power combining transformer, and configured to provide a third output signal based on the first output signal and the second output signal,
    wherein the first primary winding, the second primary winding and the first secondary winding are stacked in a vertical direction, and
    wherein the third primary winding, the fourth primary winding and the second secondary winding are stacked in the vertical direction.

2. The 3D stacked parallel-parallel power combiner of claim 1, wherein, in a cross-sectional view, the first secondary winding is interposed between the first primary winding and the second primary winding.

3. The 3D stacked parallel-parallel power combiner of claim 2, wherein the first secondary winding is magnetically coupled to the first primary winding and the second primary winding.

4. The 3D stacked parallel-parallel power combiner of claim 2, wherein a thickness of the first secondary winding is greater than a thickness of the first primary winding and a thickness of the second primary winding.

5. The 3D stacked parallel-parallel power combiner of claim 2, wherein a thickness of the first primary winding is substantially equal to a thickness of the second primary winding.

6. The 3D stacked parallel-parallel power combiner of claim 2, wherein, in the cross-sectional view, a first distance between the first secondary winding and the first primary winding is substantially equal to a second distance between the first secondary winding and the second primary winding.

7. The 3D stacked parallel-parallel power combiner of claim 1, wherein, in a plan view, the first primary winding, the second primary winding and the first secondary winding overlap each other.

8. The 3D stacked parallel-parallel power combiner of claim 1, wherein a first turn ratio of the first primary winding and the first secondary winding and a second turn ratio of the second primary winding and the first secondary winding are 1:1.

9. The 3D stacked parallel-parallel power combiner of claim 1, further comprising at least one power amplifier connected to an input terminal of the first primary winding and an input terminal of the second primary winding.

10. The 3D stacked parallel-parallel power combiner of claim 9, wherein the first input signal comprises a pair of first differential input signals,
    wherein the second input signal comprises a pair of second differential input signals, and
    wherein the at least one power amplifier comprises:
        a first power amplifier connected to a first input terminal of the first primary winding and configured to receive one of the first differential input signals;
        a second power amplifier connected to a second input terminal of the first primary winding and configured to receive another one of the first differential input signals;
        a third power amplifier connected to a first input terminal of the second primary winding and configured to receive one of the second differential input signals; and
        a fourth power amplifier connected to a second input terminal of the second primary winding and configured to receive another one of the second differential input signals.

11. The 3D stacked parallel-parallel power combiner of claim 1, wherein the first parallel power combiner is a T-type parallel power combiner.

12. The 3D stacked parallel-parallel power combiner of claim 11, wherein the T-type parallel power combiner is disposed in a same layer as the first secondary winding.

13. The 3D stacked parallel-parallel power combiner of claim 11, wherein the first parallel power combiner comprises:
    a first input terminal connected to the output terminal of the first parallel power combining transformer and configured to receive the first output signal;

a second input terminal connected to the output terminal of the second parallel power combining transformer and configured to receive the second output signal; and an output terminal configured to provide the third output signal.

14. The 3D stacked parallel-parallel power combiner of claim 1, wherein a parasitic capacitance between the first primary winding and the first secondary winding is symmetrical to a parasitic capacitance between the second primary winding and the first secondary winding.

15. The 3D stacked parallel-parallel power combiner of claim 1, wherein the first primary winding, the second primary winding and the first secondary winding comprise a conductive material.

16. The 3D stacked parallel-parallel power combiner of claim 15, wherein the first primary winding and the first secondary winding comprise a common conductive material.

17. The 3D stacked parallel-parallel power combiner of claim 15, wherein the first primary winding and the second primary winding comprise different conductive materials.

18. The 3D stacked parallel-parallel power combiner of claim 1, wherein a structure of the second parallel power combining transformer corresponds to a structure of the first parallel power combining transformer.

19. A communication system comprising:

an antenna;

a signal processor configured to process data to be transmitted and to generate a plurality of input transmission signals based on the processed data; and a transmission path configured to provide an output transmission signal based on the plurality of input transmission signals to the antenna, the transmission path comprising a three-dimensional (3D) stacked parallel-parallel power combiner, wherein the 3D stacked parallel-parallel power combiner comprises:

a first parallel power combining transformer comprising:

a first primary winding configured to receive a first input transmission signal;

a second primary winding configured to receive a second input transmission signal; and a first secondary winding coupled to the first primary winding and the second primary winding, and configured to provide a first output signal based on the first input transmission signal and the second input transmission signal;

a second parallel power combining transformer comprising:

a third primary winding configured to receive a third input transmission signal;

a fourth primary winding configured to receive a fourth input transmission signal; and a second secondary winding coupled to the third primary winding and the fourth primary winding, and configured to provide a second output signal based on the third input transmission signal and the fourth input transmission signal; and a first parallel power combiner connected to an output terminal of the first parallel power combining transformer and an output terminal of the second parallel power combining transformer, and configured to provide the output transmission signal based on the first output signal and the second output signal, wherein the first primary winding, the second primary winding and the first secondary winding are stacked in a vertical direction, and wherein the third primary winding, the fourth primary winding and the second secondary winding are stacked in the vertical direction.

20. A three-dimensional (3D) stacked parallel power combiner comprising:

a first power amplifier configured to receive one of a pair of first differential input signals;

a second power amplifier configured to receive another one of the first differential input signals;

a third power amplifier configured to receive one of a pair of second differential input signals;

a fourth power amplifier configured to receive another one of the second differential input signals;

a first primary winding comprising a first input terminal connected to an output terminal of the first power amplifier and a second input terminal connected to an output terminal of the second power amplifier, and configured to receive the first differential input signals amplified by the first power amplifier and the second power amplifier;

a second primary winding comprising a first input terminal connected to an output terminal of the third power amplifier and a second input terminal connected to an output terminal of the fourth power amplifier, and configured to receive the second differential input signals amplified by the third power amplifier and the fourth power amplifier; and a first secondary winding coupled to the first primary winding and the second primary winding, and configured to provide a pair of first differential output signals based on the first differential input signals and the second differential input signals, wherein the first primary winding, the second primary winding and the first secondary winding are stacked in a vertical direction, and wherein, in a cross-sectional view, the first secondary winding is interposed between the first primary winding and the second primary winding.

* * * * *